United States Patent [19]

Kim et al.

[11] Patent Number: 5,504,357

[45] Date of Patent: Apr. 2, 1996

[54] DYNAMIC RANDOM ACCESS MEMORY HAVING A VERTICAL TRANSISTOR

[75] Inventors: Jong S. Kim, Sungnam; Hee-Koo Yoon, Seoul; Chung G. Choi, Kyoungki-Do, all of Rep. of Korea

[73] Assignee: Hyundai Electronics Industries, Co., Ltd., Kyoungki-do, Rep. of Korea

[21] Appl. No.: 269,218

[22] Filed: Jun. 30, 1994

Related U.S. Application Data

[62] Division of Ser. No. 951,174, Sep. 24, 1992, Pat. No. 5,376,575.

[30] Foreign Application Priority Data

Sep. 26, 1991 [KR] Rep. of Korea ............ 91-16756

[51] Int. Cl.⁶ ................................................. H01L 27/108
[52] U.S. Cl. .................. 257/306; 257/302; 257/330
[58] Field of Search ................................. 257/302, 306, 257/330, 303, 306

[56] References Cited

U.S. PATENT DOCUMENTS 4,630,088  12/1986  Ogura et al. ..................... 257/302
5,307,310   4/1994  Narita ............................... 257/330

FOREIGN PATENT DOCUMENTS 1-307260  12/1989  Japan ................................. 257/302

*Primary Examiner*—Robert P. Limanek

[57] ABSTRACT

A DRAM having a vertical transistor of a highly integrated semiconductor device and its manufacturing method are disclosed. A DRAM has a silicon substrate, a word line formed in a silicon substrate, a gate oxide layer formed on the side wall of the word line, a bit line junction region formed on the bottom of a silicon substrate, a bit line that is connected to the a bit line junction region and is insulated from the word line via a first insulating layer, a charge storage electrode junction region formed near the bottom of silicon substrate surface, a pad polysilicon layer that is insulated from the a word line via a second insulating layer and is connected at the top of a charge storage electrode diffusion region, and a charge storage electrode that is connected to the pad polysilicon layer through a contact. Accordingly, a channel region is formed on a silicon substrate positioned on the side wall of a word line by applying the voltage to the word line and thus a signal transmitter is mutually transferred from the bit line to the charge storage electrode.

9 Claims, 6 Drawing Sheets

DYNAMIC RANDOM ACCESS MEMORY HAVING A VERTICAL TRANSISTOR

This is a divisional of application Ser. No. 07/951,174 filed Sep. 24, 1992, now U.S. Pat. No. 5,376,575.

BACKGROUND OF THE INVENTION

1. Field of the Invention

The invention relates to a DRAM (Dynamic Random Access Memory) of a highly integrated semiconductor device and a method of manufacturing the same, and more particularly to a DRAM having a vertical transistor whose bit line is buried in a silicon substrate and a method of manufacturing the same.

2. Related Art

Generally, the unit cell of a DRAM memory device consists of a switching transistor and a storage capacitor. As the memory device is highly integrated, the area occupied by the unit cell is reduced and thus the areas for the switching transistor and the storage capacitor must be also decreased.

Furthermore, the switching transistor is formed on the surface of the silicon substrate. In order to reduce the area of the switching transistor, the areas occupied by a source/drain and a gate of the switching transistor must be reduced. However, if areas of the source and drain are reduced, the contact process becomes difficult. Also, a serious short channel effect is produced when the gate area of the transistor is reduced. Accordingly, the area occupied by the switching transistor can be decreased only to a certain size and no more.

It is therefore an object of the present invention to provide a DRAM having a vertical transistor, which can easily reduce the area occupied by the switching transistor. The present invention accomplishes above object by providing a DRAM having a vertical transistor wherein a bit line is buried in the silicon substrate thus removing the area on the top of substrate occupied by the bit line.

Also, a word line is formed vertically on the surface of the substrate via a trench process, thereby the gate length can be elongated irrespective of the size of the unit cell thus reducing a short channel effect. Furthermore, a charge storage electrode is formed at the entrance of the trench as a stacked structure. Accordingly, on the surface of the substrate, only the charge storage electrode exists, thus, the area occupied by the charge storage electrode per unit cell can be extremely increased further unlike the conventional structure.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The dynamic random access memory having a vertical transistor and the method of manufacturing such device of the present invention are defined by the claims with specific embodiments shown in the attached drawings. For the purpose of summarizing the invention, the invention relates to a dynamic random access memory having a vertical transistor comprising a silicon substrate.

Then, a word line is formed in said silicon substrate, in which said word line forms a vertical channel region and a gate oxide layer is formed on sidewall of said word line.

A bit line junction region is connected to the lower pair of said channel region and is formed on the lower part of said silicon substrate and a bitline is connected to said bit line junction region and is insulated from said word line via a first insulating layer.

A charge storage electrode junction region is connected to the upper part of said channel region and is formed below the surface of said silicon substrate and a pad polysilicon layer is connected to the upper part of said charge storage electrode junction region and is insulated from said word line via the second insulating layer.

Next, a charge storage electrode is connected to said pad polysilicon layer via contact, whereby when a voltage is applied to said word line, said channel region is formed on the side wall of said word line so that the signal transmitter is mutually transferred from said bit line to said charge storage electrode.

Further, for the purpose of summarizing the invention, the invention relates to a method of manufacturing a dynamic random access memory having a vertical transistor comprising providing a silicon substrate. Then a first trench mask is formed on a desired portion of the upper portion of said substrate.

A first trench is formed by etching a desired portion of said silicon substrate, using said first trench mask and an insulating layer spacer is formed on the sidewall of said first trench by anisotropic etching process after forming an insulating layer in said first trench.

A second trench is formed in the lower part of said first trench by etching the desired portion of the exposed silicon substrate and a bit line junction region is formed on the bottom portion and the side wall of said second trench by ion implantation process.

A bitline is formed only on a desired region in said second trench via etch-back process after filling a bit line conducting layer in said first and second trench and a word line mask is formed on the desired surface of said silicon substrate after forming an oxide layer on said bit line.

A first insulating layer is formed by etching said exposed oxide layer which is positioned on the lower pair of said slot to the lower pair of said first trench after forming a slot by etching the desired portion of said oxide layer and the exposed silicon substrate and said word line mask positioned on said silicon substrate is removed.

A gate oxide layer is formed on the side wall of the exposed first trench and said slot and a word line having a desired thickness is formed by etch-back process after filling a word line conducting layer in said first trench and a second insulating layer is formed on said word line and a pad polysilicon is formed on said second insulating layer and a charge storage electrode junction region is formed on the outer wall of said pad polysilicon and second insulating layer by ion-implantation process.

An oxide layer is deposited over the entire structure and a contact is formed by etching a desired portion of said oxide layer, using a charge storage electrode contact mask and a charge storage electrode is formed on said contact.

The more pertinent and important features of the present invention have been outlined above in order that the detailed description of the invention which follows will be better understood and that the present contribution to the air can be fully appreciated. Additional features of the invention described hereinafter form the subject of the claims of the invention. Those skilled in the air can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For a fuller understanding of the nature and object of the invention, reference should be made to the following detailed description of the invention in conjunction with the accompanying drawings, in which.

Figure 1:
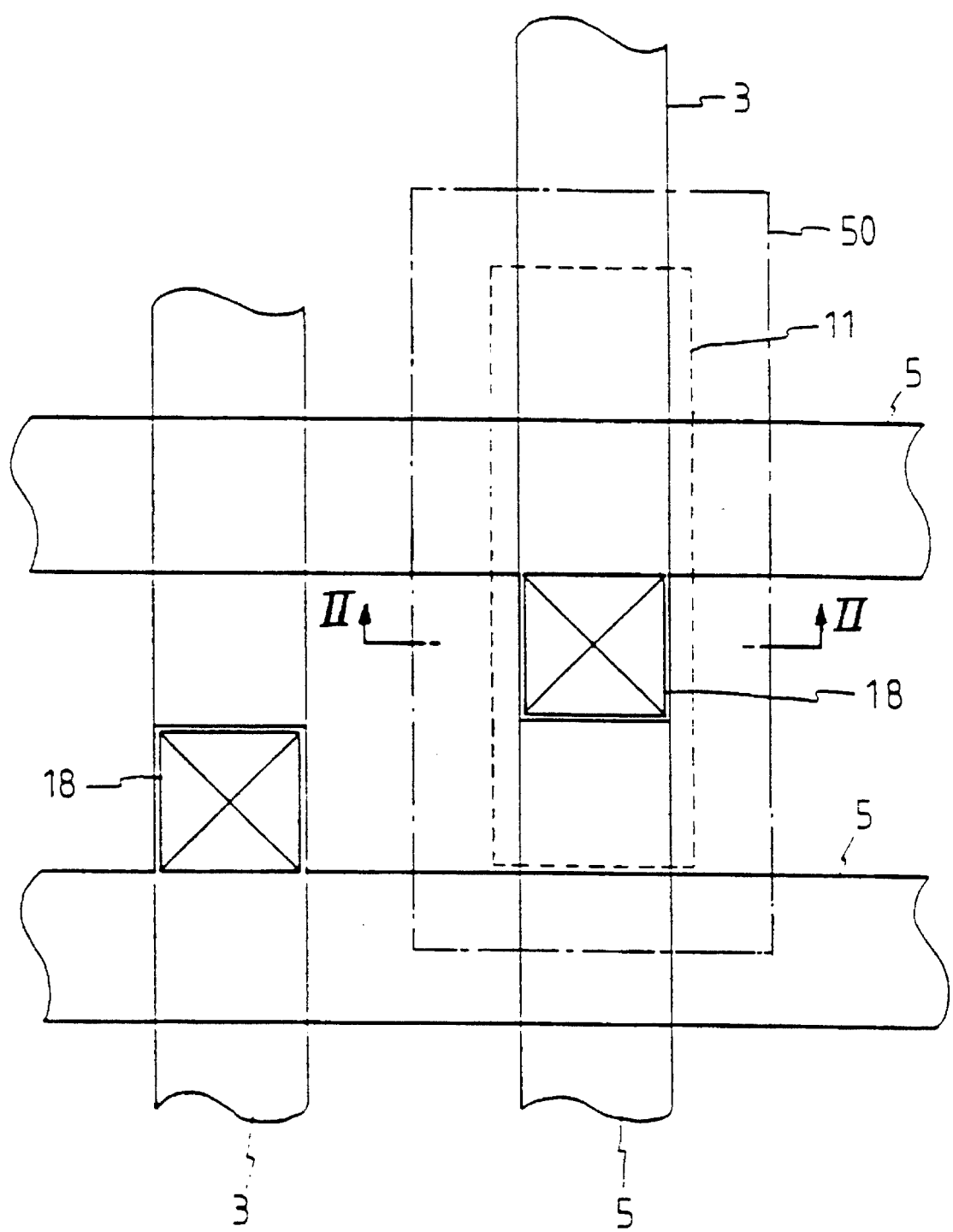
FIG.1 is a plane view of a DRAM having a vertical transistor in accordance with the present invention.

The novel feature of the present invention may be understood form the accompanying description when taken in conjunction with the accompanying drawings.

Similar reference characters refer to similar parts throughout the several views of the drawings.

DETAILED DESCRIPTION OF THE INVENTION

FIG.1 is plan view of the DRAM having a vertical transistor manufactured by the present invention. Here, the cell of the DRAM is manufactured based on the folded bit line structure. A bit line 3 is arranged lengthwise and a word line 5 is arranged horizontally so that it vertically crosses the bit line 3. Also, a charge storage electrode 11 and a charge storage electrode contact 18 are arranged respectively. At this time, if 0.3 μm is applied as a design rule, the area of the unit cell becomes 1.05 μm$^2$. Accordingly, the occupation ratio of the area of the charge storage electrode respect to the area of the unit cell is 46%, which is a satisfactory value.

Figure 2:
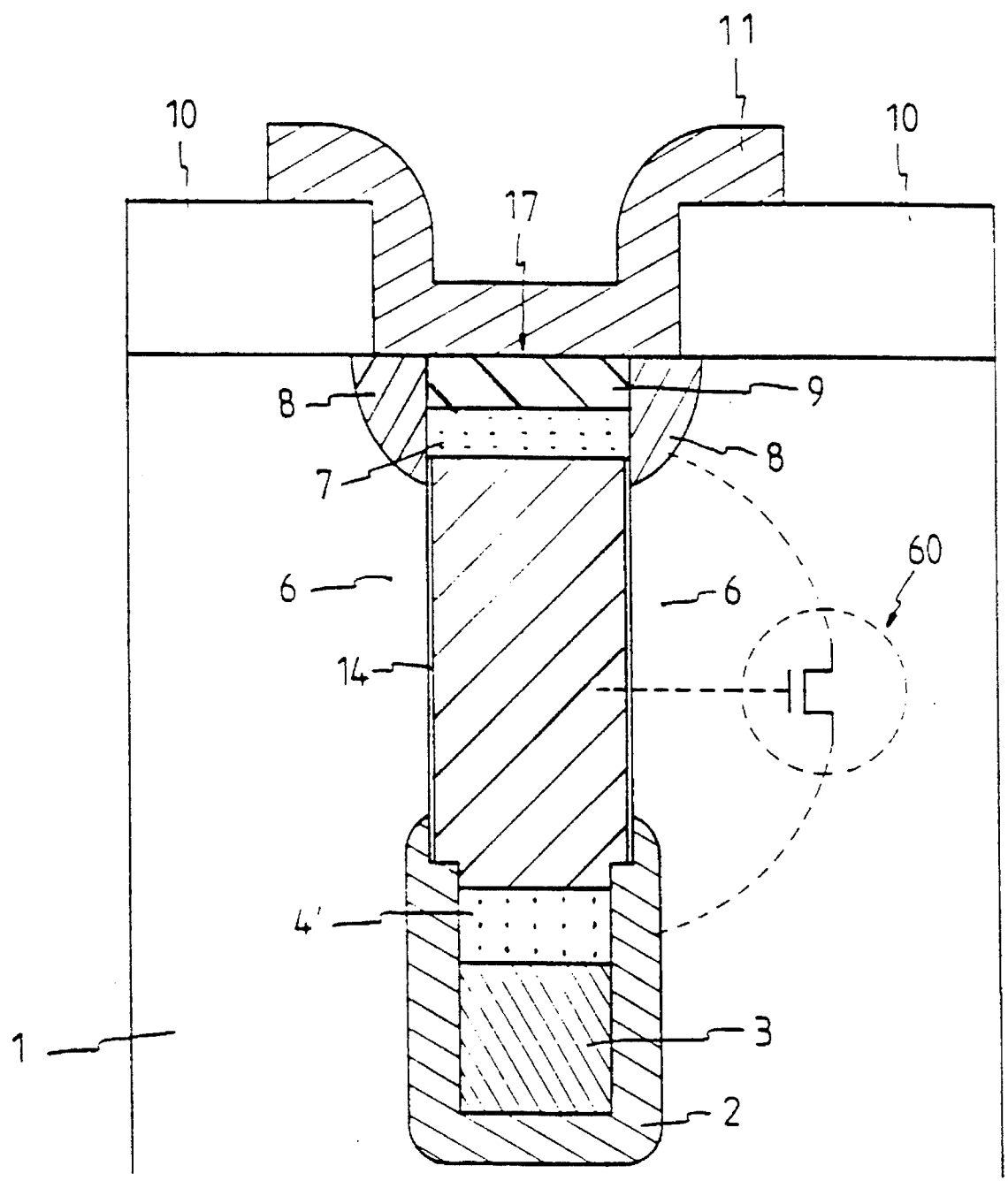
FIG.2 is a cross-sectional view of a DRAM having a vertical transistor, taken on line a—a' of FIG.1.

FIG.2 is a cross sectional view taken on line a—a' of FIG.1. That is, the structure of the DRAM having a vertical transistor with buried bit line is illustrated. In the structure, there are first trench 30 and second trench and 40 formed sequentially in a silicon substrate 1. Also, the switching transistor of the unit cell is formed in the trench and a capacitor is formed on the top of the silicon substrate 1. The bit line 3 is formed in a second trench 40 of the substrate 1 in parallel with the surface of the substrate 1. On the top of the bit line 3, a first insulating layer 4 is formed on the bit line 3 and a word line 5 is formed on the top of the first trench 30. A channel region 6 is vertically formed respective to the surface of the substrate 1. A second insulating layer 7 is formed between the word line 5 and a pad polysilicon layer 9. A charge storage electrode 11 is formed on the top of the pad polysilicon 9. Also, a charge storage electrode junction region 8 is formed on the side wall of the pad polysilicon 9 and the second insulating layer 7 by diffusing an impurity contained in the pad polysilicon 9. A bit line junction region 2 is formed on the side wall of the bit line 3 by diffusing an impurity from the bit line 3. Next, for a fuller understanding of the invention, the cell operation is described by referring to an equivalent circuit 60.

First, as in the general cell operation, if a voltage is applied to the word line 5, a channel 6 is formed on the wall of the second trench 40 and a signal transmitter moves from the bit line 3, via a bit line junction region 2, to the channel region 6. Then, the signal transmitter reaches the pad polysilicon 9 via the charge storage electrode junction region 8. Finally, the signal transmitter is stored in a charge storage electrode 11.

FIG.3A through FIG.3G are cross sectional views that illustrate the manufacturing steps of the DRAM of the present invention.

Figure 3A:
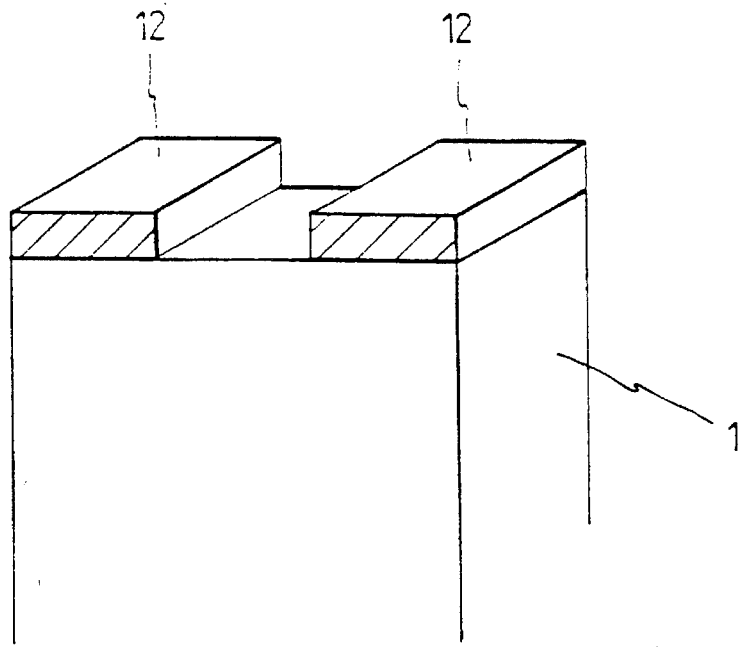
FIG.3A through FIG. 3G are cross-sectional views which illustrate the manufacturing steps of DRAM in accordance with the present invention.

FIG.3A is a cross sectional view that depicts the forming of a first trench mask 11 on the top of the silicon substrate 1.

Figure 3B:
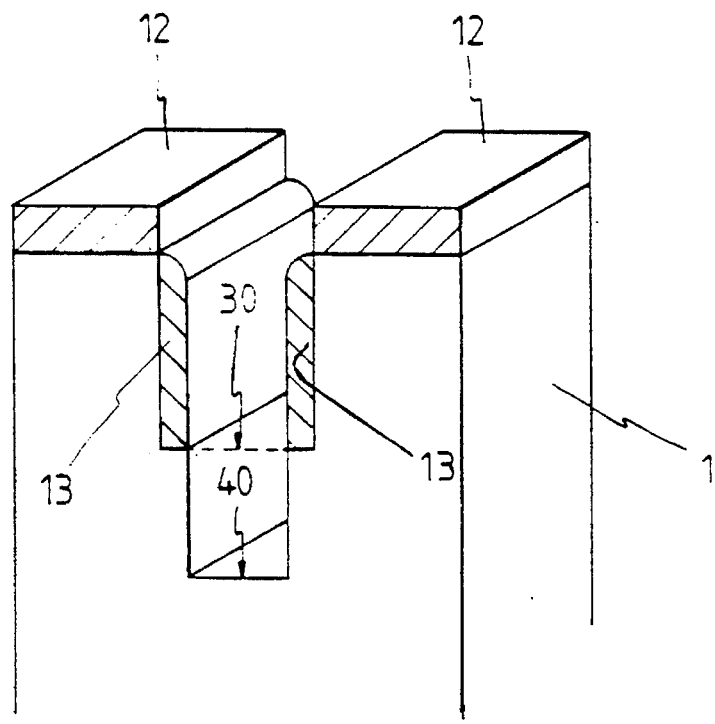

Referring to FIG.3B, a first trench 30 having a predetermined depth is formed by etching the exposed silicon substrate 1 using the first trench mask 12 after carrying out the process of FIG.3A. Next, the insulating layer such as an oxide layer having a predetermined thickness is deposited over the bottom, wall, and top surfaces of the first trench 30. Then, the insulating layer is etched via an anisotropic etching process to form an insulating layer spacer 13 on the wall surface of the first trench 30. Furthermore, by etching the exposed silicon substrate 1 of the lower pair of the first trench 30, a second trench 40 having a predetermined depth is formed.

Figure 3C:
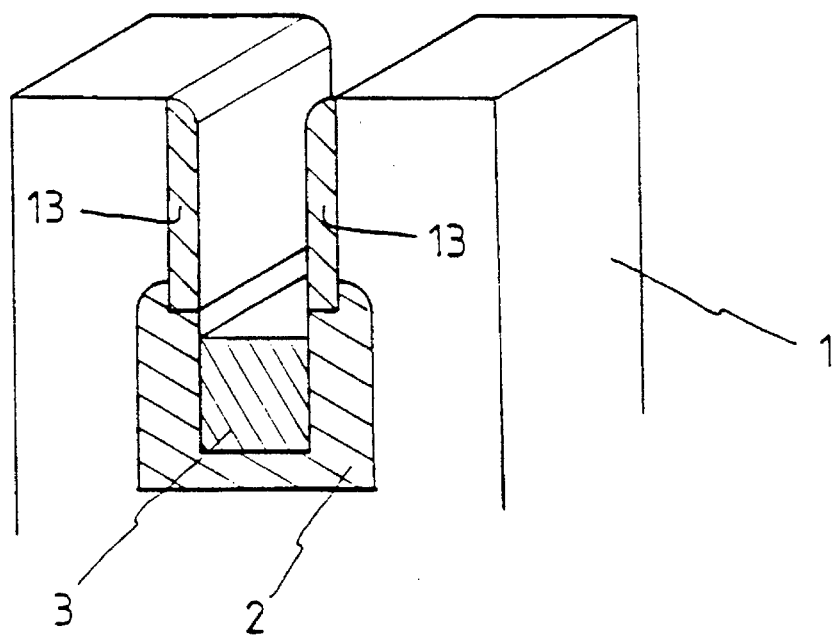

Referring to FIG.3C, the bit line junction region 2 is formed by implanting the impurity whose type is different from that of the substrate into the lower pair and the wall surface of said second trench 40. Then, the bit line polysilicon is deposited into the first trench 30 and the second trench 40. Finally, the bit line 3 is formed by leaving the poly-silicon having a predetermined depth on the second trench 40 via an etch-back process.

At this time, the bit line junction region 2 can be formed by diffusing the impurity contained in the bit line 3 after forming the bit line 3. It should be noted that that the bit line junction region 2 is used as a source of the transistor.

Figure 3D:
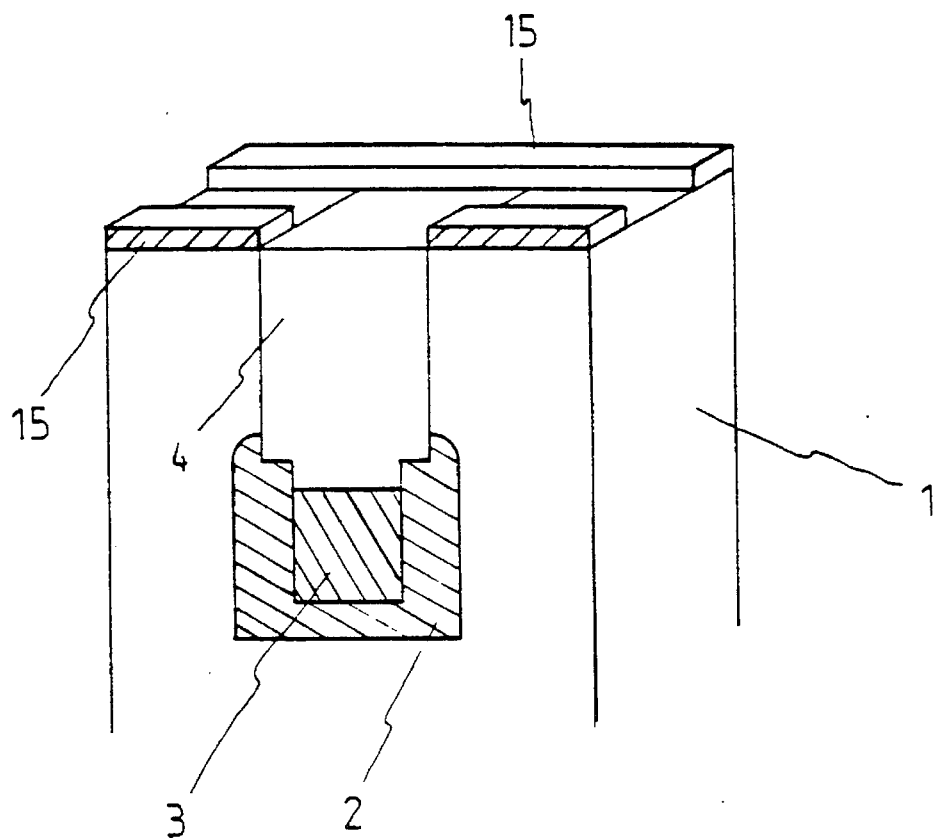

FIG.3D is a cross sectional view that illustrates the forming of the word line mask 15 on the silicon substrate 1 and the first insulating layer 4' in such a way that the word line mask 15 crosses the bit line 3 vertically after filling up to the top surface of said first trench 30 with the first insulating layer 4' such as the oxide material 4.

Figure 3E:
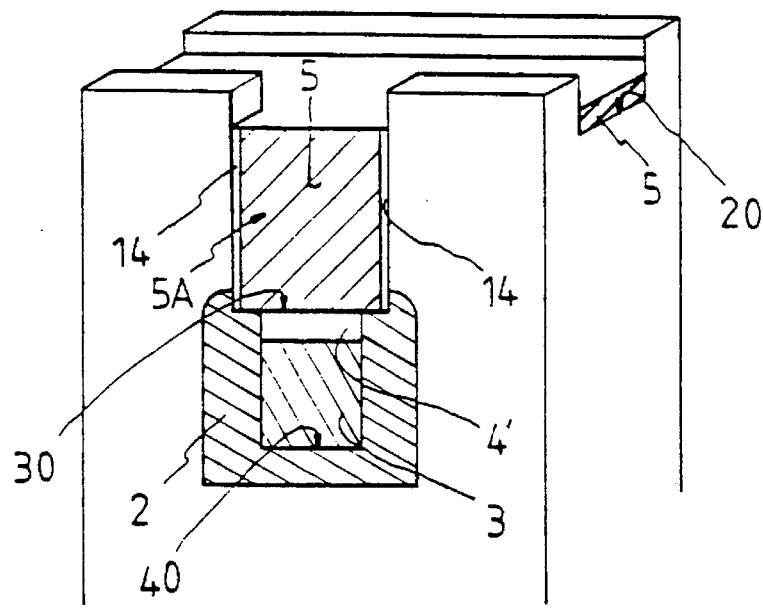

Referring to FIG.3E, a slot 20 having a predetermined depth is formed so as to form a word line 5 in the silicon substrate 1 after carrying out the process mentioned in FIG.3D. Then, the first insulating layer 4' that fills up inside of the first trench of the region where the slot 20 had been formed is removed thus exposing the first trench 30. At this time, the first insulating layer 4' on the top of the second trench 40 is not removed and is used for the insulation between the bit line 3 and the word line 5 to be formed later. Then, a gate oxide layer 14 is formed on the wall surface of the first trench 30 and a word line polysilicon layer 5A is deposited over said slot 20 and inner and top surface of the first trench 30. Then, word line polysilicon layer 5A is etched to a predetermined thickness so that its height is lower than the surface of the silicon substrate 1. Finally the word line mask 15 is removed after forming the word line 5 by filling up slot 20 and said first trench with the word line polysilicon layer 5A.

Figure 3F:
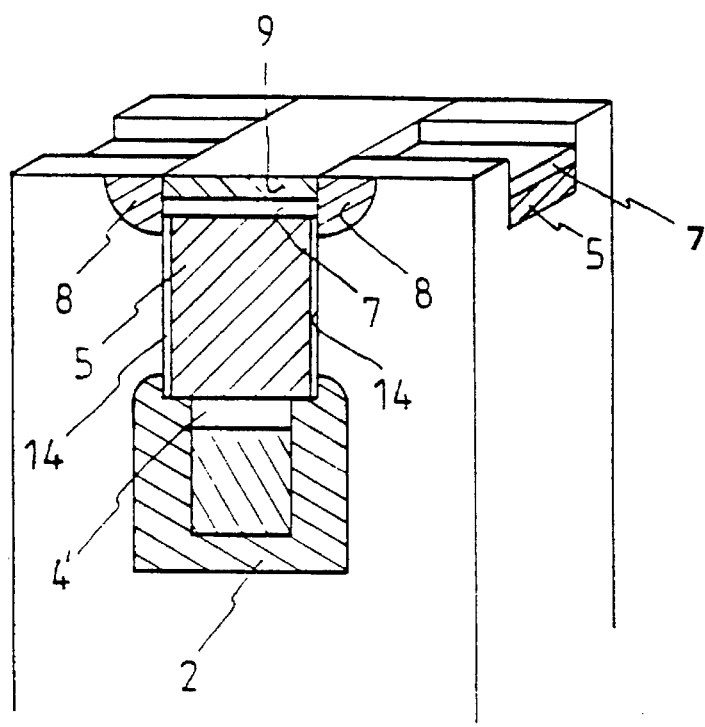

Referring to FIG.3F, a second insulating layer 7 such as an oxide layer having a predetermined thickness is formed on the top of the word line 5. Then, the polysilicon layer is deposited over the top surfaces of the second insulating layer 7 and the silicon substrate 1. Having done so, leave the polysilicon up to the surface of the silicon substrate 1 of top surface of the word line 5 via an etch-back process. Then, a pad polysilicon 9 is created and by diffusing the impurity contained in this pad polysilicon 9 to the adjacent silicon substrate 1, thereby, a charge storage electrode junction region 8 is formed. It should be noted that the charge storage electrode junction region 8 can be formed by diffusing the impurity to the exposed silicon substrate 1 of the slot 20 before forming the pad polysilicon layer 9.

Here, the charge storage electrode junction region 8 is used as a drain of the transistor.

Figure 3G:
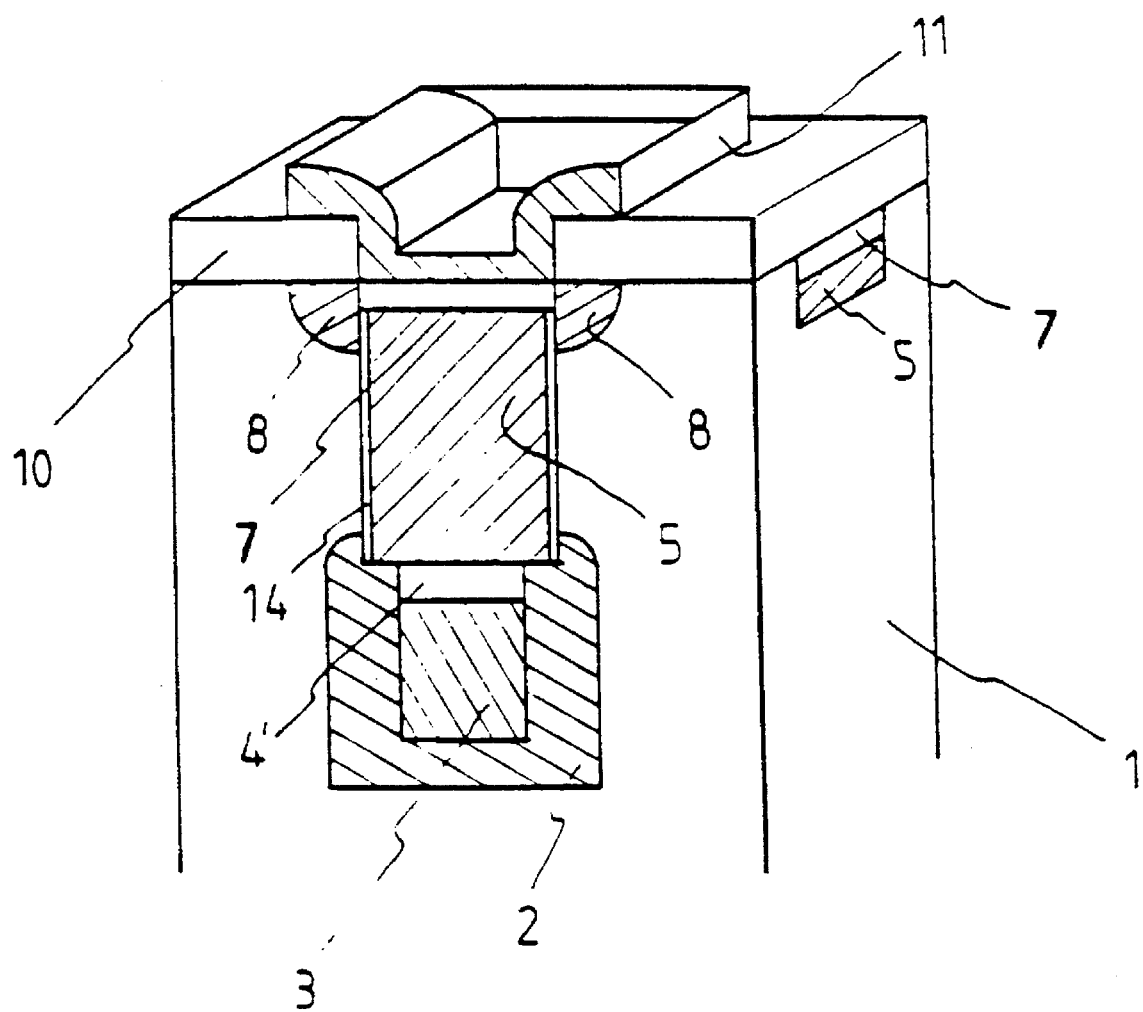

Referring to FIG.3G, after completing the process of FIG.3F, a thick oxide layer is formed on the exposed silicon substrate 1 and the pad polysilicon 9.

Also, a contact hole 17 is formed using a charge storage electrode contact mask. Then, after depositing the polysilicon layer used for the charge storage electrode 11 in the contact hole 17, the charge storage electrode 11 is formed using the charge storage electrode contact mask. Having done so, the DRAM is formed by forming a dielectric layer and a plate electrode on the top of the charge storage electrode respectively.

As discussed so far, when manufacturing the DRAM of the present invention, a channel is formed vertically in respect to the substrate so that the channel length can be set freely without worrying about the area occupied by the cell. Thus, the affect of the miniaturized device that occurs in a highly integrated memory device can be minimized. Also, since two channels are available, the current of the transistor is increased, thereby decreasing the operation time of the semiconductor chip.

Furthermore, since there is only the charge storage capacitor on the surface of the silicon substrate 1, the ratio of the storage capacitor area to the cell area is increased so that the process of forming a capacitor can be easily carried out.

Although this invention has been described in its preferred form with a certain degree of particularity, it is appreciated by those skilled in the air that the present disclosure of the preferred form has been made only by way of example and that numerous changes in the details of the construction, combination and arrangement of pairs may be resorted to without departing from the spirit and scope of the invention.

What is claimed is:

1. A dynamic random access memory having a vertical transistor, comprising:

a silicon substrate having an upper surface and having a trench having a bottom surface, a wall surface, and an opening at the upper surface of the silicon substrate;

a bit line junction region extending into the silicon substrate from said bottom surface and from a lower region of said wall surface that is adjacent to said bottom surface;

a bit fine at said bottom surface of the trench and connected to said bitline junction region;

a word line formed in the trench and insulated from said bit line by a first insulating layer, and insulated from the wall surface by a gate oxide layer formed on the wall surface, whereby a vertical channel region is defined in the semiconductor substrate along the gate oxide layer under the word line;

a charge storage electrode junction region extending from a region of the wall surface near the opening at the upper surface and connected to said channel region and formed below the surface of said silicon substrate;

a pad polysilicon layer connected to the upper part of said charge storage electrode junction region and insulated from said word line via a second insulating layer;

a charge storage electrode connected to said pad polysilicon layer, whereby when a voltage is applied to said word line, said vertical channel region is formed so that a signal transmitter is transferred from said bit line to said charge storage electrode.

2. A dynamic random access memory according to claim 1, wherein said bit line junction region and said charge storage electrode junction region are formed in such a way that they overlap with the word line, and insulated from the word line via the gate oxide layer.

3. A dynamic random access memory according to claim 1, wherein said bit line is formed lengthwise at the bottom of the silicon substrate.

4. A dynamic random access memory according to claim 1, wherein said word line is formed lengthwise along a slot on the silicon substrate so that it vertically crosses the bit line.

5. A dynamic random access memory according to claim 1, wherein said channel is formed on said silicon substrate of the trench wall surface directed toward the word line from a region where the bit line and a word line cross each other.

6. A dynamic random access memory according to claim 1, wherein a switching transistor is formed in said silicon substrate.

7. A dynamic random access memory according to claim 1, wherein said signal transmitter is moved from the bit line to the channel region through a bit line junction region and then moves to the pad polysilicon layer through the charge storage electrode junction region, finally, it reaches the charge storage electrode.

8. A dynamic random access memory according to claim 1, wherein said charge storage electrode is formed on said pad polysilicon thereby forming a stacked capacitor.

9. A dynamic random access memory according to claim 8, wherein said stacked capacitor is formed on the surface of the substrate so as to maximize the area of the charge storage capacitor per unit cell.

* * * * *